(12) United States Patent
Chen et al.

(10) Patent No.: US 9,680,089 B1
(45) Date of Patent: Jun. 13, 2017

(54) MAGNETIC TUNNEL JUNCTIONS

(71) Applicant: Micron Technology, Inc., Boise, ID (US)

(72) Inventors: Wei Chen, Poets Villas (SG); Witold Kula, Gilroy, CA (US); Manzar Siddik, Ang Mo Kio (SG); Suresh Ramarajan, Seletaris (SG); Jonathan D. Harms, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/154,033

(22) Filed: May 13, 2016

(51) Int. Cl.
*H01L 43/10* (2006.01)
*H01L 43/08* (2006.01)
(Continued)

(52) U.S. Cl.
CPC ............ *H01L 43/10* (2013.01); *G11C 11/161* (2013.01); *H01L 43/02* (2013.01); *H01L 43/08* (2013.01)

(58) Field of Classification Search
CPC ......... H01L 43/10; H01L 43/02; H01L 43/08; G11C 11/161; G11C 11/15; G11C 11/155; G11B 5/127
(Continued)

(56) References Cited

U.S. PATENT DOCUMENTS 5,640,343 A 6/1997 Gallagher et al.
5,898,548 A 4/1999 Dill
(Continued)

FOREIGN PATENT DOCUMENTS

JP 2008-034857 2/2008
JP 2010-034153 2/2010
(Continued)

OTHER PUBLICATIONS

Annealing influence on the Gilbert damping parameter and the exchange constant of CoFeB thin films; Conca et al.; Applied Physics Letter 104; May 8, 2014; pp. 182407-1-182401-4.
(Continued)

*Primary Examiner* — Yasser A Abdelaziez
(74) *Attorney, Agent, or Firm* — Wells St. john, P.S.

(57) ABSTRACT

A magnetic tunnel junction comprises a conductive first magnetic electrode comprising magnetic recording material, a conductive second magnetic electrode spaced from the first electrode and comprising magnetic reference material, and a non-magnetic tunnel insulator material between the first and second electrodes. The magnetic reference material of the second electrode comprises a synthetic antiferromagnetic construction comprising two spaced magnetic regions one of which is closer to the tunnel insulator material than is the other. The one magnetic region comprises a polarizer region comprising $Co_xFe_yB_z$ where "x" is from 0 to 90, "y" is from 10 to 90, and "z" is from 10 to 50. The $Co_xFe_yB_z$ is directly against the tunnel insulator. A non-magnetic region comprising an Os-containing material is between the two spaced magnetic regions. The other magnetic region comprises a magnetic Co-containing material. Other embodiments are disclosed.

24 Claims, 2 Drawing Sheets

(51) Int. Cl.
*H01L 43/02* (2006.01)
*G11C 11/16* (2006.01)
(58) Field of Classification Search
USPC .................................................. 257/421
See application file for complete search history.

(56) References Cited

U.S. PATENT DOCUMENTS

| | | |
|---|---|---|
| 5,949,600 A | 9/1999 | Akiyama |
| 5,994,899 A | 11/1999 | Mohri |
| 6,048,632 A | 4/2000 | Solin |
| 6,538,921 B2 | 3/2003 | Daughton |
| 6,600,184 B1 | 7/2003 | Gill |
| 6,788,502 B1 | 9/2004 | Gill |
| 7,324,313 B2 | 1/2008 | Childress |
| 7,595,520 B2 | 9/2009 | Horng et al. |
| 7,629,637 B2 | 12/2009 | Kajiyama et al. |
| 7,660,153 B2 | 2/2010 | Yamane et al. |
| 7,944,738 B2 | 5/2011 | Liu et al. |
| 7,981,697 B2 | 7/2011 | Wang |
| 8,102,700 B2 | 1/2012 | Liu et al. |
| 8,218,357 B2 | 7/2012 | Liu et al. |
| 8,310,861 B2 | 11/2012 | Liu et al. |
| 8,553,450 B2 | 10/2013 | Hosotani et al. |
| 8,559,141 B1 | 10/2013 | Pakala |
| 8,836,056 B2 | 9/2014 | Oguz et al. |
| 8,842,465 B2 | 9/2014 | Yamane et al. |
| 9,099,124 B1 | 8/2015 | Freitag |
| 9,177,573 B1 | 11/2015 | Oh |
| 9,257,136 B1 | 2/2016 | Siddik |
| 2003/0206379 A1* | 11/2003 | Lin .................. B82Y 10/00 360/319 |
| 2004/0057295 A1 | 3/2004 | Matsukawa et al. |
| 2005/0006682 A1 | 1/2005 | Bae et al. |
| 2005/0247964 A1 | 11/2005 | Pietambaram et al. |
| 2005/0254289 A1 | 11/2005 | Nakajima et al. |
| 2006/0017081 A1 | 1/2006 | Sun et al. |
| 2007/0064350 A1 | 3/2007 | Gill |
| 2007/0064352 A1 | 3/2007 | Gill |
| 2007/0096229 A1 | 5/2007 | Yoshikawa |
| 2007/0217075 A1 | 9/2007 | Kamata |
| 2007/0243638 A1 | 10/2007 | Horng et al. |
| 2008/0144234 A1 | 6/2008 | Lin |
| 2008/0164548 A1 | 7/2008 | Ranjan |
| 2008/0182015 A1 | 7/2008 | Parkin |
| 2009/0046397 A1 | 2/2009 | Sun et al. |
| 2009/0161422 A1* | 6/2009 | Zhu .................. G11C 11/16 365/171 |
| 2010/0006960 A1 | 1/2010 | Horng et al. |
| 2010/0080894 A1 | 4/2010 | Tsunekawa |
| 2011/0062538 A1 | 3/2011 | Rizzo et al. |
| 2011/0149646 A1 | 6/2011 | Liu et al. |
| 2011/0318848 A1 | 12/2011 | Choi |
| 2012/0056285 A1 | 3/2012 | Bessho |
| 2012/0068139 A1 | 3/2012 | Daibou |
| 2012/0087179 A1 | 4/2012 | Jung |
| 2012/0127603 A1 | 5/2012 | Gao |
| 2012/0193216 A1 | 8/2012 | Endo |
| 2012/0241879 A1 | 9/2012 | Ikeno et al. |
| 2012/0286382 A1 | 11/2012 | Jan et al. |
| 2013/0004796 A1 | 1/2013 | Peng et al. |
| 2013/0037862 A1 | 2/2013 | Kitagawa et al. |
| 2013/0071954 A1 | 3/2013 | Zhou |
| 2013/0148418 A1 | 6/2013 | Luo et al. |
| 2013/0177781 A1 | 7/2013 | Chepulskyy et al. |
| 2013/0181305 A1 | 7/2013 | Nakayama et al. |
| 2013/0224521 A1 | 8/2013 | Wang et al. |
| 2013/0236639 A1 | 9/2013 | Carey |
| 2013/0241015 A1 | 9/2013 | Nomachi |
| 2013/0307097 A1 | 11/2013 | Yi et al. |
| 2014/0027869 A1 | 1/2014 | Lee et al. |
| 2014/0038314 A1 | 2/2014 | Zhou |
| 2014/0084401 A1 | 3/2014 | Kato |
| 2014/0117477 A1 | 5/2014 | Park et al. |
| 2014/0131649 A1 | 5/2014 | Daibou et al. |
| 2014/0145792 A1 | 5/2014 | Wang et al. |
| 2014/0175581 A1 | 6/2014 | Guo |
| 2014/0203383 A1 | 7/2014 | Guo |
| 2014/0248719 A1 | 9/2014 | Zhou et al. |
| 2014/0269033 A1 | 9/2014 | Natori et al. |
| 2014/0284742 A1 | 9/2014 | Sawada et al. |
| 2014/0287537 A1 | 9/2014 | Shukh |
| 2015/0069562 A1 | 3/2015 | Sandhu |
| 2015/0076633 A1 | 3/2015 | Siddik et al. |
| 2015/0102439 A1 | 4/2015 | Gan et al. |
| 2015/0137289 A1 | 5/2015 | Khalili-Amiri |
| 2015/0280113 A1 | 10/2015 | Tan |
| 2016/0105176 A1 | 4/2016 | Miura |
| 2016/0254445 A1* | 9/2016 | Tahmasebi ............. H01L 43/12 438/3 |

FOREIGN PATENT DOCUMENTS

| | | |
|---|---|---|
| JP | 2012-059808 | 3/2012 |
| JP | 2012-519957 | 8/2012 |
| JP | 2012-204432 | 10/2012 |
| JP | 2013-140891 | 7/2013 |
| KR | 10-2008-0084590 | 9/2008 |
| KR | 10-2015-0031311 | 3/2015 |
| WO | PCT/US2014/047572 | 10/2014 |
| WO | PCT/US2015/061568 | 2/2016 |
| WO | PCT/US2014/047572 | 3/2016 |
| WO | PCT/US2016/018045 | 5/2016 |
| WO | PCT/US2016/18015 | 6/2016 |
| WO | PCT/US2016/018077 | 6/2016 |
| WO | PCT/US2016/014259 | 7/2016 |
| WO | PCT/US2016/24219 | 7/2016 |
| WO | PCT/US2015/061568 | 12/2016 |

OTHER PUBLICATIONS

Annealing of CoFeB/MgO based single and double barrier magnetic tunnel junctions: Tunnel magnetoresistance, bias dependence, and output voltage; Feng et al; Journal of Applied Physics, vol. 105, Feb. 11, 2009; pp. 033916-1 to 033916-7.

Atomic and Electronic Structure of CoFeB/MgO Interface from First Principles; Burton et al.; Applied Physics Letters, vol. 89; Oct. 5, 2006; pp. 142507-1 to 142507-3.

Boron diffusion in magnetic tunnel junctions with MgO (001) barriers and CoFeB electrodes; Kurt et al.; Applied Physics Letters, vol. 96; Jun. 28, 2010; pp. 262501-1 to 262501-3.

Boron diffusion induced symmetry reduction and scattering in CoFeB/MgO/CoFeB magnetic tunnel junctions; Bai et al.; The American Physical Society; Physical Review B, vol. 87; Jan. 23, 2013; pp. 014114-1 to 014114-6.

Boron migration due to annealing in CoFeB/MgO/CoFeB interfaces: A combined hard x-ray.photoelectron spectroscopy and x-ray absorption studies; Rumaiz et al.; Applied Physics Letters, vol. 99; Nov. 28, 2011; pp. 222502-1 to 222502-3.

Boron segregation in crystallized MgO/amorphous-Co 40 Fe 40 B 20 Co 40 Fe 40 B 20 Co 40 Fe 40 B 20 thin films; You et al.; Journal of Applied Physics, vol. 104, Aug. 5, 2008; pp. 033517-1 to 033517-6.

Comparative material issues for fast reliable switching in STT-RAMs; Munira et al.; 2011 11th IEEE International Conference on Nanotechnology; Aug. 15-18, 2012; pp. 1403-1408.

Comparison of Synthetic Antiferromagnets and Hard Ferromagnets as Reference Layer in Magnetic Tunnel Junctions With Perpendicular Magnetic Anisotropy; Bandiera et al.; Spin Electronics; IEE Magnetics Letters, vol. 1; Jul. 8, 2010; 4 pp.

Damping of CoxFe80-xB20 ultrathin films with perendicular magnetic anisotropy; Devolder et al.; Applied Physics Letters 102; Jan. 15, 2013; pp. 022407-1-022407-4.

Exchange coupling of bilayers and synthetic antiferromagnets pinned to MnPt; Rickart et al.; The European Physical Journal B; Mar. 8, 2005; pp. 1-6.

Giant tunnelling magnetoresistance at room temperature with MgO (100) tunnel barriers; Parkin et al.; nature materials, vol. 3; Oct. 31, 2004; pp. 862-867.

(56) References Cited

OTHER PUBLICATIONS

Magnetic Tunnel Junctions; Zhu et al.; Materialstoday; vol. 9, No. 11; Nov. 2006; pp. 36-45.
Magnetoresistive Random-Access Memory; www.wikipedia.org/wiki/RAM; As downloaded from the Internet Jul. 28, 2013; 10 pp.
MgO barrier-perpendicular magnetic tunnel junctions with CoFe/Pd multilayers and ferromagnetic insertion layers; Mizunuma et al.; Laboratory for Nanoelectronics and Spintronics, Research Institute of Electrical Communication, Tohoku University; Advanced Research Laboratory, Hitachi, Ltd.; Dec. 11, 2009; 17 pp.
Microstructure and magnetic properties of FeCoN thin films; Kuo et al.; Journal of Applied Physics, vol. 83, No. 11; Jun. 1, 1998; pp. 6643-6645.
On the role of Ta cap in the recrystallization process of CoFeB layers; Bouchikhaoui et al.; Applied Physics Letters, vol. 103; Oct. 3, 2013; pp. 142412-1 to 142412-5.
Spin Pumping and Spin Transfer; Brataas et al.; arXiv:1108.0385v3[cond-ma.tmes-hall]; Mar. 6, 2012; pp.1-30.
Spin-dependent tunneling conductance of $Fe_zMg_zO_zFe$ sandwiches; Butler et al.; The American Physical Society; Physical Review B, vol. 63; Jan. 8, 2001; pp. 054416-1 to 054416-12.
Spin-Transfer Torque; www.wikipedia.org/wiki/Spin-transfer_torque; As downloaded from the Internet Aug. 2, 2013; 2 pp.
Sputtered FeCoN Soft Magnetic Thin Films With High Resistivity; Jiang et al.; IEEE Transactions on Magnetics, vol. 39, No. 6; Nov. 2003; pp. 3559-3562.
Status and Challenges for Non-Volatile Spin-Transfer Torque RAM (STT-RAM); Krounbi et al.; International Symposium on Advanced Gate Stack-Technology; Sep. 23, 2010; 28 pp.
Theory of tunneling magnetoresistance of an epitaxial FeÖMgOÖFe/001 junction; Manthan et al.; The American Physical Society; Physical Review B, vol. 63; May 10, 2001; pp. 220403-1 to 220403-4.
Tunnel Magnetoresistance; www.wikipedia.org/wiki/tunnel_manetoresistance; As downloaded from the Internet Jul. 28, 2013; 5 pp.
Variation in the properties of the interface in a CoFeB/MgO/CoFeB tunnel junction during thermal annealing; Jang et al.; Applied Physics Letters, vol. 91; Sep. 4, 2007; pp. 102104-1 to 102104-3.
Zhang et al.; Large magnetoresistance in bcc Co/MgO/Co and FeCo/MgO/FeCo tunnel junctions; The American Physical Society; Physical Review B, vol. 70; Nov. 17, 2004; pp. 172407-1 to 172407-4.
U.S. Appl. No. 14/023,138, filed Sep. 10, 2013, Sandhu.
U.S. Appl. No. 14/563,303, filed Dec. 18, 2013, Chen et al.
U.S. Appl. No. 14/684,110, filed Apr. 10, 2150, Sandhu.
U.S. Appl. No. 14/687,280, filed Apr. 14, 2015, Siddik et al.
U.S. Appl. No. 14/687,317, filed Apr. 15, 2015, Siddik.
U.S. Appl. No. 14/704,023, filed May 5, 2015, Siddik.
U.S. Appl. No. 14/706,182, filed May 7, 2015, Harms.
U.S. Appl. No. 14/746,412, filed Jun. 22, 2015, Chen et al.
Marakov, A.; Chapter 4: Magnetoresistive Memory; Dissertation—Modeling of Emerging Resistive Switching Based Memory Cells; Apr. 4, 1985; 11 pp.
Sbiaa et al.; Materials with perpendicular magnetic anisotropy for magnetic random access memory; Phys. Status Solidi RRL 5, No. 12; 2011; pp. 413-419.

\* cited by examiner

MAGNETIC TUNNEL JUNCTIONS

TECHNICAL FIELD

Embodiments disclosed herein pertain to magnetic tunnel junctions.

BACKGROUND

A magnetic tunnel junction is an integrated circuit component having two conductive magnetic electrodes separated by a thin non-magnetic tunnel insulator material (e.g., dielectric material). The insulator material is sufficiently thin such that electrons can tunnel from one magnetic electrode to the other through the insulator material under appropriate conditions. At least one of the magnetic electrodes can have its overall magnetization direction switched between two states at a normal operating write or erase current/voltage, and is commonly referred to as the "free" or "recording" electrode. The other magnetic electrode is commonly referred to as the "reference", "fixed", or "pinned" electrode, and whose overall magnetization direction will not switch upon application of the normal operating write or erase current/voltage. The reference electrode and the recording electrode are electrically coupled to respective conductive nodes. Electrical resistance between those two nodes through the reference electrode, insulator material, and the recording electrode is dependent upon the magnetization direction of the recording electrode relative to that of the reference electrode. Accordingly, a magnetic tunnel junction can be programmed into one of at least two states, and those states can be sensed by measuring current flow through the magnetic tunnel junction. Since magnetic tunnel junctions can be "programmed" between two current-conducting states, they have been proposed for use in memory integrated circuitry. Additionally, magnetic tunnel junctions may be used in logic or other circuitry apart from or in addition to memory.

The overall magnetization direction of the recording electrode can be switched by a current-induced external magnetic field or by using a spin-polarized current to result in a spin-transfer torque (STT) effect. Charge carriers (such as electrons) have a property known as "spin" which is a small quantity of angular momentum intrinsic to the carrier. An electric current is generally unpolarized (having about 50% "spin-up" and about 50% "spin-down" electrons). A spin-polarized current is one with significantly more electrons of either spin. By passing a current through certain magnetic material (sometimes also referred to as polarizer material), one can produce a spin-polarized current. If a spin-polarized current is directed into a magnetic material, spin angular momentum can be transferred to that material, thereby affecting its magnetization orientation. This can be used to excite magnetization precession or even flip (i.e., switch) the orientation/domain direction of the magnetic material if the spin-polarized current is of sufficient magnitude.

DETAILED DESCRIPTION OF EXAMPLE EMBODIMENTS

Figure 1:
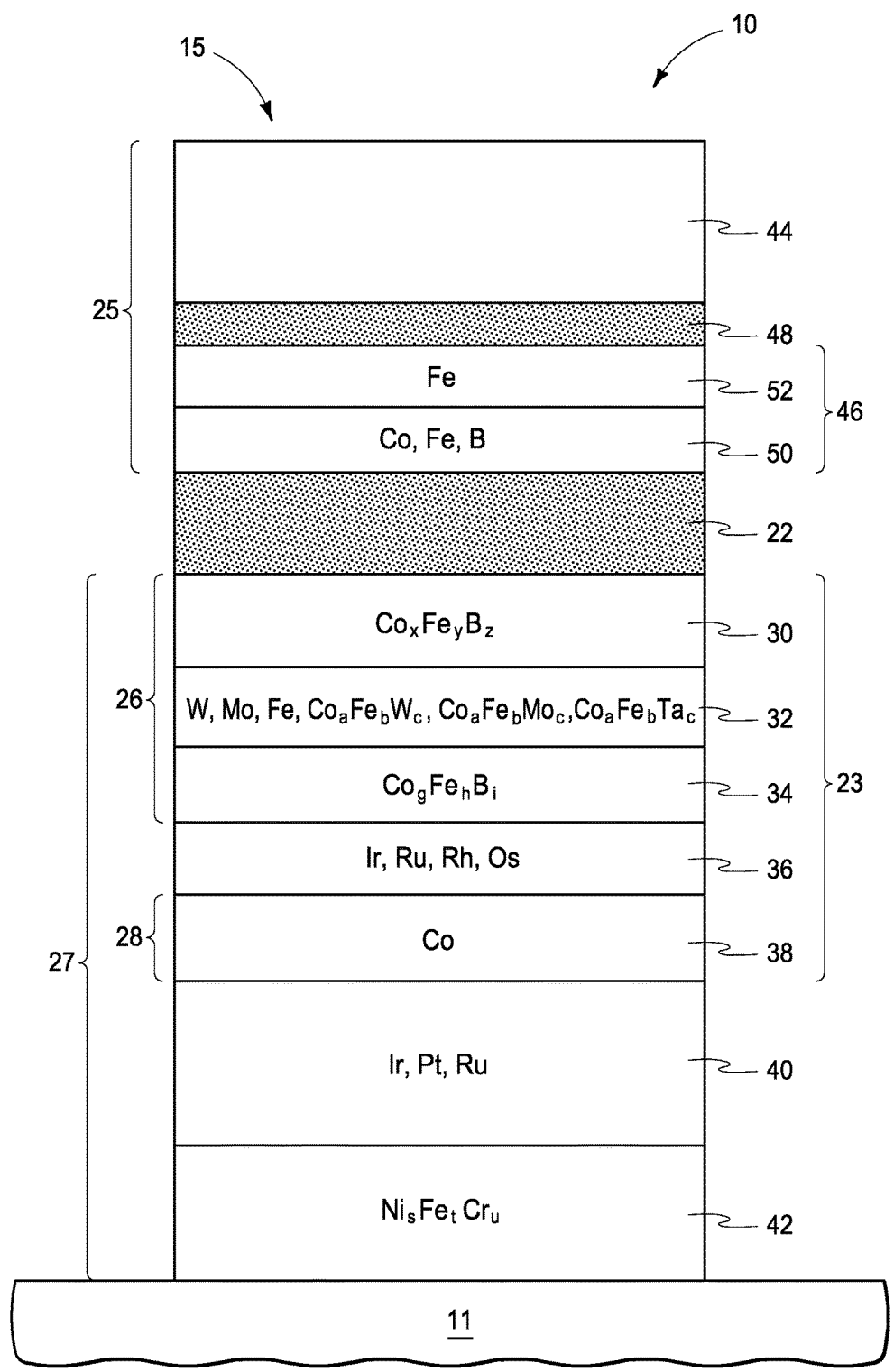
FIG. 1 is a diagrammatic sectional view of a substrate fragment comprising a magnetic tunnel junction in accordance with an embodiment of the invention.

Embodiments of the invention encompass magnetic tunnel junctions. Example embodiments are initially described with reference to FIG. 1 with respect to a substrate fragment 10, and which may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate fragment 10 comprises a base or substrate 11 showing various materials having been formed as an elevational stack there-over. Materials may be aside, elevationally inward, or elevationally outward of the FIG. 1-depicted materials. For example, other partially or wholly fabricated components of integrated circuitry may be provided somewhere about or within fragment 10. Substrate 11 may comprise any one or more of conductive (i.e., electrically herein), semiconductive, or insulative/insulator (i.e., electrically herein) materials. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

A magnetic tunnel junction 15 is over substrate 11, and comprises a conductive first magnetic (i.e., ferrimagnetic or ferromagnetic herein) electrode 25 comprising magnetic recording material and a conductive second magnetic electrode 27 spaced from first electrode 25 and comprising magnetic reference material. A non-magnetic tunnel insulator material 22 (e.g., comprising, consisting essentially of, or consisting of MgO) is between the first and second electrodes. Electrodes 25 and 27 individually may contain non-magnetic insulator, semiconductive, and/or conductive material or regions. However, electrodes 25 and 27 when considered individually are characterized as being overall and collectively magnetic and conductive even though the electrode may have one or more regions therein that are intrinsically locally non-magnetic and/or non-conductive. Further, reference to "magnetic" herein does not require a stated magnetic material or region to be magnetic as initially formed, but does require some portion of the stated magnetic material or region to be functionally "magnetic" in a finished circuit construction of the magnetic tunnel junction.

Example thickness ranges for each of components 25 and 27 is about 20 Angstroms to about 250 Angstroms, and for component 22 about 5 Angstroms to about 50 Angstroms. An ideal thickness for component 27 is about 110 Angstroms. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials and regions described herein may be of substantially constant thickness or of variable thicknesses. If of variable thickness, thickness refers to average thickness unless otherwise indicated. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", and "against" not preceded by "directly" encompass "directly against" as well as construction where intervening material(s), region(s), or structure(s) result(s) in no physical touching contact of the stated materials, regions, or structures relative one another.

The elevational positions of electrodes 25 and 27 may be reversed and/or an orientation other than an elevational stack may be used (e.g., lateral; diagonal; a combination of one or more of elevational, horizontal, diagonal; etc.). In this document, "elevational", "upper", "lower", "top", and "bottom" are with reference to the vertical direction. "Horizontal" refers to a general direction along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space.

The magnetic reference material of second conductive magnetic electrode 27 comprises a synthetic antiferromagnetic construction 23 that comprises two spaced magnetic regions 26 and 28 one of which (26) is closer to tunnel insulator material 22 than is the other (28). The one magnetic region comprises a polarizer region 30 comprising $Co_xFe_yB_z$ where "x" is from 0 to 90, "y" is from 10 to 90, and "z" is from 10 to 50 (i.e., x+y+z totaling 100). Polarizer region 30 may comprise, consist essentially of, or consist of such $Co_xFe_yB_z$. Regardless, $Co_xFe_yB_z$ thereof is directly against tunnel insulator 22. In one embodiment, "x" is zero and in another embodiment "x" is greater than zero. Example thickness ranges for the $Co_xFe_yB_z$ are 5 Angstroms to 20 Angstroms and 5 Angstroms to 15 Angstroms, with 7 Angstroms being one ideal example.

At least one of elemental W, elemental Mo, elemental Fe, $Co_aFe_bW_c$, $Co_aFe_bMo_c$, and $Co_aFe_bTa_c$ is directly against the $Co_xFe_yB_z$, where "a" is from 0 to 50, "b" is from 50 to 99, and "c" is from 1 to 50 (i.e., a+b+c totaling 100). Such is shown as a region 32 which may comprise, consist essentially of, or consist of one or more of such materials. In one embodiment, such material of region 32 that is directly against the $Co_xFe_yB_z$ is elemental W, in one embodiment is elemental Mo, in one embodiment is elemental Fe, in one embodiment is $Co_aFe_bW_c$, in one embodiment is $Co_aFe_b$-$Mo_c$, or in one embodiment is $Co_aFe_bTa_c$. In one embodiment, the material of region 32 that is directly against the $Co_xFe_yB_z$ comprises a mixture or alloy of at least two of elemental W, elemental Mo, elemental Fe, $Co_aFe_bW_c$, $Co_aF$-$e_bMo_c$, and $Co_aFe_bTa_c$, and in one embodiment comprises a mixture or alloy of at least three of such compositions. Example thickness ranges for region 32 are 1 Angstrom to 10 Angstroms and 2 Angstroms to 5 Angstroms, with 2 Angstroms being one ideal example.

Magnetic $Co_gFe_hB_i$ of a region 34 is directly against the at least one of elemental W, elemental Mo, elemental Fe, $Co_aFe_bW_c$, $Co_aFe_bMo_c$, and $Co_aFe_bTa_c$, where "g" is from 0 to 100, "h" is from 0 to 90, and "i" is from 0 to 50 (i.e., g+h+i totaling 100), with at least one of "g" and "h" being greater than zero. Example thickness ranges for the $Co_gFe_hB_i$ are 5 Angstroms to 30 Angstroms and 10 Angstroms to 20 Angstroms, with 7 Angstroms being one ideal example. Region 34 may comprise, consist essentially of, or consist of $Co_gFe_hB_i$.

A non-magnetic region 36 comprising at least one of Ir-containing material, Ru-containing material, Rh-containing material, and Os-containing material is between spaced magnetic regions 26 and 28. Such materials may comprise one or more dopants and/or other materials in combination with the Ru, Rh, and/or Os. Such dopants and/or other materials may tailor chemical and/or physical properties of region 36 for particular applications. The at least one of Ir-containing material, Ru-containing material, Rh-containing material, and Os-containing material is directly against cobalt-containing material as described below. In one embodiment, the at least one of Ir-containing material, Ru-containing material, Rh-containing material, and Os-containing material are at least one of elemental Ir, elemental Ru, elemental Rh, and elemental Os, respectively. In one embodiment, the at least one of Ir-containing material, Ru-containing material, Rh-containing material, and Os-containing material are a mixture or alloy of at least two of elemental Ir, elemental Ru, elemental Rh, and elemental Os, and in one embodiment a mixture or alloy of at least three of elemental Ir, elemental Ru, elemental Rh, and elemental Os. Example thickness ranges for the at least one of Ir-containing material, Ru-containing material, Rh-containing material, and Os-containing material (e.g., region 36) are 2 Angstroms to 10 Angstroms and 5 Angstroms to 7 Angstroms, with 7 Angstroms being one ideal example. Regardless, non-magnetic region 36 may comprise, consist essentially of, or consist of one or more of such materials.

Other magnetic region 28 comprises a magnetic Co-containing material 38 directly against the at least one of Ir-containing material, Ru-containing material, Rh-containing material, and Os-containing material of region 36. Co-containing material 38 may comprise one or more dopants and/or other materials in combination with the Co. Such dopants and/or other materials may tailor chemical and/or physical properties of region 36 for particular applications. In one embodiment, magnetic Co-containing material 38 is elemental Co. Example thickness ranges for Co-containing material 38 are 5 Angstroms to 30 Angstroms and 10 Angstroms to 20 Angstroms, with 14 Angstroms being one ideal example. Region 28 may comprise, consist essentially of, or consist of Co-containing material.

In one embodiment, second electrode 27 comprises a non-magnetic region 40 comprising at least one of non-magnetic elemental Ir, non-magnetic elemental Pt, and non-magnetic elemental Ru that is directly against magnetic Co-containing material 38. Co-containing material 38 is between a) the at least one of Ir-containing material, Ru-containing material, Rh-containing material, and Os-containing material of region 36 and b) the at least one of non-magnetic elemental Ir, non-magnetic elemental Pt, and non-magnetic elemental Ru of region 40. In one embodiment, the at least one of non-magnetic elemental Ir, non-magnetic elemental Pt, and non-magnetic elemental Ru comprises a mixture or alloy of at least two of elemental Ir, elemental Pt, and elemental Ru, and in one embodiment a mixture or alloy of at least three of elemental Ir, elemental Pt, and elemental Ru. Example thickness ranges for the at least one of elemental Ir, elemental Pt, and elemental Ru (e.g., region 40) are 0 Angstroms to 100 Angstroms, 5 Angstroms to 100 Angstroms, and 5 Angstroms to 50 Angstroms, with 50 Angstroms being one ideal example. Regardless, non-magnetic region 40 may comprise, consist essentially of, or consist of one or more of such materials.

In one embodiment, second electrode 27 comprises non-magnetic $Ni_sFe_tCr_u$ of a non-magnetic region 42 directly against the at least one of non-magnetic elemental Ir, non-magnetic elemental Pt, and non-magnetic elemental Ru of region 40, where "s" is from 50 to 100, "t" is from 0 to 30, and "u" is from 0 to 45 (i.e., s+t+u totaling 100). Region 40 is between magnetic Co-containing material 38 and non-magnetic $Ni_sFe_tCr_u$. 42. Example thickness ranges for $Ni_s$-$Fe_tCr_u$ 42 are 0 Angstroms to 60 Angstroms, 5 Angstroms to 60 Angstroms, and 10 Angstroms to 40 Angstroms, with 30 Angstroms being one ideal example. Regardless, region 42 may comprise, consist essentially of, or consist of $Ni_sFe_tCr_u$.

In one embodiment, conductive first magnetic electrode 25 comprises non-magnetic conductive material 44 and magnetic recording material 46. Non-magnetic conductive material 44 may be any suitable conductive material(s) such as elemental metals, an alloy or mixture of elemental metals, conductive metal compounds, and conductively doped semiconductor material, with Ru being but one example. An example thickness range for material 44 is 10 to 500 Angstroms. In one embodiment, dielectric material 48 is between non-magnetic conductive material 44 and magnetic recording material 46 (in one embodiment directly against at least one and in one embodiment directly against both), and magnetic recording material 46 is between dielectric material 48 and tunnel insulator 22. In one embodiment, first magnetic electrode 25 is devoid of any magnetic polarizer region between dielectric material 48 and non-magnetic conductive material 44. In one embodiment, tunnel insulator 22 and dielectric material 48 are the same composition, and which in one embodiment is MgO. Example thickness ranges for dielectric material 48 are 5 Angstroms to 50 Angstroms, 5 Angstroms to 20 Angstroms, and 5 Angstroms to 15 Angstroms, with 15 Angstroms being one ideal example. In one embodiment, dielectric material 48 has a smaller thickness than that of tunnel insulator 22. Example thickness ranges for magnetic recording material 46 are 5 Angstroms to 50 Angstroms and 5 Angstroms to 20 Angstroms, with 13 Angstroms being one ideal example.

In one embodiment, magnetic recording material 46 comprises an alloy 50 comprising Co, Fe, and B, and comprises Fe 52 directly against alloy 50. In one embodiment, alloy 50 is directly against tunnel insulator 22. Example ideal thicknesses for alloy 50 and Fe 52 are 10 Angstroms and 3 Angstroms, respectively.

Ideally the materials and regions of first electrode 25 and second electrode 27 are crystalline (e.g., ideally all BCC 001) although such may be amorphous or include amorphous material and regions. Characterization of a material or region as being "crystalline" where used in this document requires at least 90% by volume of the stated material or region to be crystalline. Characterization of a material or region as being "amorphous" where used in this document requires at least 90% by volume of the stated material to be amorphous.

Figure 2:
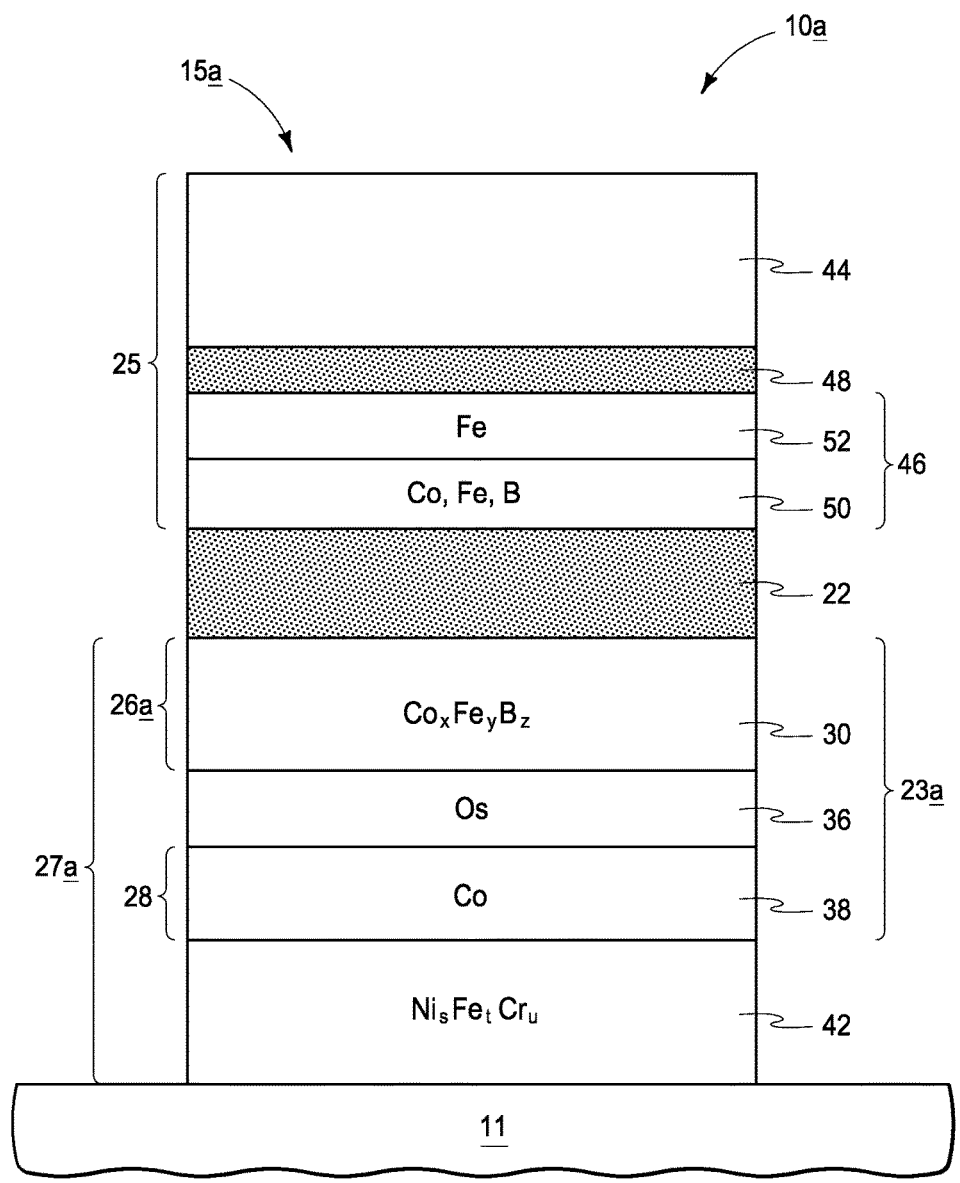
FIG. 2 is a diagrammatic sectional view of a substrate fragment comprising a magnetic tunnel junction in accordance with an embodiment of the invention.

Another example embodiment magnetic tunnel junction 15a is shown with respect to a substrate fragment 10a in FIG. 2. Like numerals from the above-described embodiments have been used where appropriate, with some construction differences being indicated with the suffix "a".

Synthetic antiferromagnetic construction 23a of the magnetic reference material of second electrode 27a comprises two spaced magnetic regions 26a and 28 one of which (26a) is closer to tunnel insulator material 22 than is the other (28). Again, the one magnetic region comprises polarizer region 30 comprising the $Co_xFe_yB_z$ referred to above that is directly against tunnel insulator 22. In one ideal example, the $Co_xFe_yB_z$ of polarizer region 30 is 10 Angstroms in thickness. Non-magnetic region 36 is between magnetic regions 26a and 28 (in certain embodiments directly against at least one or both of regions 26a and 28) and comprises an Os-containing material. Non-magnetic region 36 may comprise, consist essentially of, or consist of Os-containing material. In one embodiment, the Os-containing material is elemental Os. Any other attribute(s) or aspect(s) as described above and/or shown in FIG. 1 may be used in the FIG. 2 embodiments.

The example embodiments of FIGS. 1 and 2 depict single magnetic tunnel junctions (SMTJs). However, dual magnetic tunnel junctions (DMTJs) or more than dual (two) magnetic tunnel junctions are contemplated (i.e., having at least two tunnel insulator regions and a respective polarizer region proximate thereto).

The magnetic tunnel junctions discussed above may be utilized in memory products or specific memory technologies (e.g., MRAM. STT-MRAM, etc.), or in other technologies (e.g., logic, sensors, oscillators, etc.). The magnetic tunnel junctions may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

CONCLUSION

In some embodiments, a magnetic tunnel junction comprises a conductive first magnetic electrode comprising magnetic recording material, a conductive second magnetic electrode spaced from the first electrode and comprising magnetic reference material, and a non-magnetic tunnel insulator material between the first and second electrodes. The magnetic reference material of the second electrode comprises a synthetic antiferromagnetic construction comprising two spaced magnetic regions one of which is closer to the tunnel insulator material than is the other. The one magnetic region comprises a polarizer region comprising $Co_xFe_yB_z$ where "x" is from 0 to 90, "y" is from 10 to 90, and "z" is from 10 to 50. The $Co_xFe_yB_z$ is directly against the tunnel insulator. At least one of elemental W, elemental Mo, elemental Fe, $Co_aFe_bW_c$, $Co_aFe_bMo_c$, and $Co_aFe_bTa_c$ is directly against the $Co_xFe_yB_z$, where "a" is from 0 to 50, "b" is from 50 to 99, and "c" is from 1 to 50. Magnetic $Co_gFe_hB_i$ is directly against the at least one of elemental W, elemental Mo, elemental Fe, $Co_aFe_bW_c$, $Co_aFe_bMo_c$, and $Co_aFe_bTa_c$, where "g" is from 0 to 100, "h" is from 0 to 90, and "i" is from 0 to 50, with at least one of "g" and "h" being greater than zero. A non-magnetic region comprising at least one of Ir-containing material, Ru-containing material, Rh-containing material, and Os-containing material is between the two spaced magnetic regions. The at least one of Ir-containing material, Ru-containing material, Rh-containing material, and Os-containing material is directly against the elemental Co. The other magnetic region comprises a magnetic Co-containing material directly against the at least one of Ir-containing material, Ru-containing material, Rh-containing material, and Os-containing material.

In some embodiments, a magnetic tunnel junction comprises a conductive first magnetic electrode comprising magnetic recording material comprising 3 Angstroms thick Fe directly against an alloy comprising Co, Fe, and B that is 10 Angstroms thick. A conductive second magnetic electrode is spaced from the first electrode and comprises magnetic reference material. A non-magnetic tunnel insulator material is between the first and second electrodes. The first magnetic electrode comprises dielectric material directly against the Fe. The alloy comprising Co, Fe, and B is directly against the tunnel insulator. The first magnetic electrode comprises non-magnetic conductive material that is directly against the dielectric material. The first magnetic electrode is devoid of any magnetic polarizer region between the dielectric material and the non-magnetic conductive material. The magnetic reference material of the second electrode comprises a synthetic antiferromagnetic construction comprising two spaced magnetic regions one of which is closer to the tunnel insulator material than is the other. The one magnetic region comprises a 7 Angstroms thick polarizer region comprising $Co_xFe_yB_z$ where "x" is from 0 to 90, "y" is from 10 to 90, and "z" is from 10 to 50. The $Co_xFe_yB_z$ is directly against the tunnel insulator. A 2 Angstroms thick region of at least one of elemental W, elemental Mo, elemental Fe, $Co_aFe_bW_c$, $Co_aFe_bMo_c$, and $Co_aFe_bTa_c$ is directly against the $Co_xFe_yB_z$, where "a" is from 0 to 50, "b" is from 50 to 99, and "c" is from 1 to 50. Seven Angstroms of magnetic $Co_gFe_hB_i$ is directly against the at least one of elemental W, elemental Mo, elemental Fe, $Co_aFe_bW_c$, $Co_aFe_bMo_c$, and $Co_aFe_bTa_c$, where "g" is from 0 to 100, "h" is from 0 to 90, and "i" is from 0 to 50 with at least one of "g" and "h" being greater than zero. A 7 Angstroms thick non-magnetic region comprising at least one of Ir-containing material, Ru-containing material, Rh-containing material, and Os-containing material is between the two spaced magnetic regions. The at least one of Ir-containing material, Ru-containing material, Rh-containing material, and Os-containing material is directly against the 7 Angstroms thick magnetic $Co_gFe_hB_i$. The other magnetic region comprises 14 Angstroms thick elemental Co directly against the at least one of Ir-containing material, Ru-containing material, Rh-containing material, and Os-containing material. At least one of non-magnetic elemental Ir, non-magnetic elemental Pt, and non-magnetic elemental Ru is directly against the 14 Angstroms thick elemental Co. Non-magnetic $Ni_sFe_tCr_u$ is directly against the at least one of non-magnetic elemental Ir, non-magnetic elemental Pt, and non-magnetic elemental Ru, where "s" is from 50 to 100, "t" is from 0 to 30, and "u" is from 0 to 45. The at least one of non-magnetic elemental Ir, non-magnetic elemental Pt, and non-magnetic elemental Ru is being between the magnetic Co-containing material and the non-magnetic $Ni_sFe_tCr_u$.

In some embodiments, a magnetic tunnel junction comprises a conductive first magnetic electrode comprising magnetic recording material, a conductive second magnetic electrode spaced from the first electrode and comprising magnetic reference material, and a non-magnetic tunnel insulator material between the first and second electrodes. The magnetic reference material of the second electrode comprises a synthetic antiferromagnetic construction comprising two spaced magnetic regions one of which is closer to the tunnel insulator material than is the other. The one magnetic region comprises a polarizer region comprising $Co_xFe_yB_z$ where "x" is from 0 to 90, "y" is from 10 to 90, and "z" is from 10 to 50. The $Co_xFe_yB_z$ is directly against the tunnel insulator. A non-magnetic region comprising an Os-containing material is between the two spaced magnetic regions. The other magnetic region comprises a magnetic Co-containing material.

In some embodiments, a magnetic tunnel junction comprises a conductive first magnetic electrode comprising magnetic recording material. A conductive second magnetic electrode spaced from the first electrode and comprising magnetic reference material. A non-magnetic tunnel insulator material is between the first and second electrodes. The first magnetic electrode comprises dielectric material. The magnetic recording material is between the dielectric material and the tunnel insulator. The first magnetic electrode comprises non-magnetic conductive material. The dielectric material is between the non-magnetic conductive material and the magnetic recording material. The first magnetic electrode is devoid of any magnetic polarizer region between the dielectric material and the non-magnetic conductive material. The magnetic reference material of the second electrode comprises a synthetic antiferromagnetic construction comprising two spaced magnetic regions one of which is closer to the tunnel insulator material than is the other. The one magnetic region comprises a polarizer region comprising $Co_xYe_yB_z$ where "x" is from 0 to 90, "y" is from 10 to 90, and "z" is from 10 to 50. The $Co_xYe_yB_z$ is directly against the tunnel insulator. A non-magnetic region comprising an Os-containing material is between the two spaced magnetic regions. The Os-containing material is directly against the $Co_xYe_yB_z$. The other spaced magnetic region comprises magnetic Co-containing material directly against the Os-containing material. Non-magnetic $Ni_sFe_tCr_u$ is directly against the magnetic Co-containing material, where "s" is from 50 to 100, "t" is from 0 to 30, and "u" is from 0 to 45. The Co-containing material is between the Os-containing material and the non-magnetic $Ni_sFe_tCr_u$.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A magnetic tunnel junction comprising:
   a conductive first magnetic electrode comprising magnetic recording material;
   a conductive second magnetic electrode spaced from the first electrode and comprising magnetic reference material;
   a non-magnetic tunnel insulator material between the first and second electrodes; and
   the magnetic reference material of the second electrode comprising a synthetic antiferromagnetic construction comprising:
      two spaced magnetic regions one of which is closer to the tunnel insulator material than is the other, the one magnetic region comprising:
         a polarizer region comprising $Co_xFe_yB_z$ where "x" is from 0 to 90, "y" is from 10 to 90, and "z" is from 10 to 50; the $Co_xFe_yB_z$ being directly against the tunnel insulator;
         at least one of elemental W, elemental Mo, elemental Fe, $Co_aFe_bW_c$, $Co_aFe_bMo_c$, and $Co_aFe_bTa_c$ directly against the $Co_xFe_yB_z$, where "a" is from 0 to 50, "b" is from 50 to 99, and "c" is from 1 to 50; and magnetic $Co_gFe_hB_i$ directly against the at least one of elemental W, elemental Mo, elemental Fe, $Co_aFe_bW_c$, $Co_aFe_bMo_c$, and $Co_aFe_bTa_c$, where "g" is from 0 to 100, "h" is from 0 to 90, and "i" is from 0 to 50, with at least one of "g" and "h" being greater than zero;

a non-magnetic region comprising at least one of Ir-containing material, Ru-containing material, Rh-containing material, and Os-containing material between the two spaced magnetic regions; and the other magnetic region comprising a magnetic Co-containing material directly against the at least one of Ir-containing material, Ru-containing material, Rh-containing material, and Os-containing material.

2. The magnetic tunnel junction of claim 1 comprising at least one of non-magnetic elemental Ir, non-magnetic elemental Pt, and non-magnetic elemental Ru directly against the magnetic Co-containing material; the Co-containing material being between a) the at least one of Ir-containing material, Ru-containing material, Rh-containing material, and Os-containing material and b) the at least one of nonmagnetic elemental Ir, non-magnetic elemental Pt, and non-magnetic elemental Ru.

3. The magnetic tunnel junction of claim 2 comprising non-magnetic $Ni_sFe_tCr_u$ directly against the at least one of non-magnetic elemental Ir, non-magnetic elemental Pt, and non-magnetic elemental Ru, where "s" is from 50 to 100, "t" is from 0 to 30, and "u" is from 0 to 45; the at least one of non-magnetic elemental Ir, non-magnetic elemental Pt, and non-magnetic elemental Ru being between the magnetic Co-containing material and the non-magnetic $Ni_sFe_tCr_u$.

4. The magnetic tunnel junction of claim 1 wherein the first magnetic electrode comprises dielectric material, the magnetic recording material being between the dielectric material and the tunnel insulator, the first magnetic electrode comprising non-magnetic conductive material, the dielectric material being between the non-magnetic conductive material and the magnetic recording material, the first magnetic electrode being devoid of any magnetic polarizer region between the dielectric material and the non-magnetic conductive material.

5. The magnetic tunnel junction of claim 4 wherein the dielectric material and the tunnel insulator are the same composition.

6. The magnetic tunnel junction of claim 5 wherein the composition is MgO.

7. The magnetic tunnel junction of claim 4 wherein the dielectric material has a smaller thickness than that of the tunnel insulator.

8. The magnetic tunnel junction of claim 1 wherein "x" is zero.

9. The magnetic tunnel junction of claim 1 wherein "x" is greater than zero.

10. The magnetic tunnel junction of claim 1 wherein the "a" is zero and the at least one of elemental W, elemental Mo, elemental Fe, $Co_aFe_bW_c$, $Co_aFe_bMo_c$, and $Co_aFe_bTa_c$ comprises at least one of $Fe_bW_c$, $Fe_bMo_c$, and $Fe_bTa_c$.

11. The magnetic tunnel junction of claim 1 wherein the at least one of elemental W, elemental Mo, elemental Fe, $Co_aFe_bW_c$, $Co_aFe_bMo_c$, and $Co_aFe_bTa_c$ comprises at least one of $Co_aFe_bW_c$, $Co_aFe_bMo_c$, and $Co_aFe_bTa_c$ where "a" is greater than zero.

12. The magnetic tunnel junction of claim 1 wherein the at least one of elemental W, elemental Mo, elemental Fe, $Co_aFe_bW_c$, $Co_aFe_bMo_c$, and $Co_aFe_bTa_c$ comprises elemental W.

13. The magnetic tunnel junction of claim 1 wherein the at least one of elemental W, elemental Mo, elemental Fe, $Co_aFe_bW_c$, $Co_aFe_bMo_c$, and $Co_aFe_bTa_c$ comprises elemental Mo.

14. The magnetic tunnel junction of claim 1 wherein the at least one of elemental W, elemental Mo, elemental Fe, $Co_aFe_bW_c$, $Co_aFe_bMo_c$, and $Co_aFe_bTa_c$ comprises elemental Fe.

15. The magnetic tunnel junction of claim 1 wherein the at least one of elemental W, elemental Mo, elemental Fe, $Co_aFe_bW_c$, $Co_aFe_bMo_c$, and $Co_aFe_bTa_c$ comprises $Co_aFe_bW_c$ where "a" is greater than zero.

16. The magnetic tunnel junction of claim 1 wherein the at least one of elemental W, elemental Mo, elemental Fe, $Co_aFe_bW_c$, $Co_aFe_bMo_c$, and $Co_aFe_bTa_c$ comprises $Co_aFe_bMo_c$ where "a" is greater than zero.

17. The magnetic tunnel junction of claim 1 wherein the at least one of elemental W, elemental Mo, elemental Fe, $Co_aFe_bW_c$, $Co_aFe_bMo_c$, and $Co_aFe_bTa_c$ comprises $Co_aFe_bTa_c$ where "a" is greater than zero.

18. The magnetic tunnel junction of claim 1 wherein the at least one of elemental W, elemental Mo, elemental Fe, $Co_aFe_bW_c$, $Co_aFe_bMo_c$, and $Co_aFe_bTa_c$ comprises a mixture or alloy of at least two of elemental W, elemental Mo, elemental Fe, $Co_aFe_bW_c$, $Co_aFe_bMo_c$, and $Co_aFe_bTa_c$.

19. The magnetic tunnel junction of claim 18 wherein the at least one of elemental W, elemental Mo, elemental Fe, $Co_aFe_bW_c$, $Co_aFe_bMo_c$, and $Co_aFe_bTa_c$ comprises a mixture or alloy of at least three of elemental W, elemental Mo, elemental Fe, $Co_aFe_bW_c$, $Co_aFe_bMo_c$, and $Co_aFe_bTa_c$.

20. The magnetic tunnel junction of claim 1 wherein the at least one of Ir-containing material, Ru-containing material, Rh-containing material, and Os-containing material comprises a mixture or alloy of at least two of elemental Ir, elemental Ru, elemental Rh, and elemental Os.

21. The magnetic tunnel junction of claim 20 wherein the at least one of Ir-containing material, Ru-containing material, Rh-containing material, and Os-containing material comprises a mixture or alloy of at least three of elemental Ir, elemental Ru, elemental Rh, and elemental Os.

22. A magnetic tunnel junction comprising:

a conductive first magnetic electrode comprising magnetic recording material comprising 3 Angstroms thick Fe directly against an alloy comprising Co, Fe, and B that is 10 Angstroms thick;

a conductive second magnetic electrode spaced from the first electrode and comprising magnetic reference material;

a non-magnetic tunnel insulator material between the first and second electrodes; and the first magnetic electrode comprising dielectric material directly against the Fe; the alloy comprising Co, Fe, and B being directly against the tunnel insulator, the first magnetic electrode comprising non-magnetic conductive material directly against the dielectric material, the first magnetic electrode being devoid of any magnetic polarizer region between the dielectric material and the non-magnetic conductive material;

the magnetic reference material of the second electrode comprising a synthetic antiferromagnetic construction comprising:

two spaced magnetic regions one of which is closer to the tunnel insulator material than is the other, the one magnetic region comprising:

a 7 Angstroms thick polarizer region comprising $Co_xFe_yB_z$ where "x" is from 0 to 90, "y" is from 10 to 90, and "z" is from 10 to 50; the $Co_xFe_yB_z$ being directly against the tunnel insulator;

a 2 Angstroms thick region of at least one of elemental W, elemental Mo, elemental Fe, $Co_aFe_bW_c$, $Co_aFe_bMo_c$, and $Co_aFe_bTa_c$ directly against the $Co_xFe_yB_z$, where "a" is from 0 to 50, "b" is from 50 to 99, and "c" is from 1 to 50; and 7 Angstroms of magnetic $Co_gFe_hB_i$ directly against the at least one of elemental W, elemental Mo, elemental Fe, $Co_aFe_bW_c$, $Co_aFe_bMo_c$, and $Co_aFe_bTa_c$, where "g" is from 0 to 100, "h" is from 0 to 90, and "i" is from 0 to 50 with at least one of "g" and "h" being greater than zero;

a 7 Angstroms thick non-magnetic region comprising at least one of Ir-containing material, Ru-containing material, Rh-containing material, and Os-containing material between the two spaced magnetic regions; the at least one of Ir-containing material, Ru-containing material, Rh-containing material, and Os-containing material being directly against the 7 Angstroms thick magnetic $Co_gFe_hB_i$; and the other magnetic region comprising 14 Angstroms thick elemental Co directly against the at least one of Ir-containing material, Ru-containing material, Rh-containing material, and Os-containing material;

at least one of non-magnetic elemental Ir, non-magnetic elemental Pt, and non-magnetic elemental Ru directly against the 14 Angstroms thick elemental Co; and non-magnetic $Ni_sFe_tCr_u$ directly against the at least one of non-magnetic elemental Ir, non-magnetic elemental Pt, and non-magnetic elemental Ru, where "s" is from 50 to 100, "t" is from 0 to 30, and "u" is from 0 to 45; the at least one of non-magnetic elemental Ir, non-magnetic elemental Pt, and non-magnetic elemental Ru being between the magnetic Co-containing material and the non-magnetic $Ni_sFe_tCr_u$.

23. The method magnetic tunnel junction of claim 22 wherein the non-magnetic $Ni_sFe_tCr_u$ is 30 Angstroms thick.

24. The magnetic tunnel junction of claim 1 wherein the Co-containing material is elemental Co.

* * * * *

UNITED STATES PATENT AND TRADEMARK OFFICE
CERTIFICATE OF CORRECTION

PATENT NO. : 9,680,089 B1
APPLICATION NO. : 15/154033
DATED : June 13, 2017
INVENTOR(S) : Wei Chen et al.

Page 1 of 1

It is certified that error appears in the above-identified patent and that said Letters Patent is hereby corrected as shown below:

In the Claims

Column 12, Line 19, Claim 23, please delete "method" after "The".

Signed and Sealed this
Fourteenth Day of November, 2017

Joseph Matal
*Performing the Functions and Duties of the
Under Secretary of Commerce for Intellectual Property and
Director of the United States Patent and Trademark Office*